(12) United States Patent
Ossif

(10) Patent No.: US 12,413,226 B2
(45) Date of Patent: Sep. 9, 2025

(54) RADIO FREQUENCY SWITCH DRIVER

(71) Applicant: ICEYE OY, Espoo (FI)

(72) Inventor: Sergei Ossif, Espoo (FI)

(73) Assignee: ICEYE OY, Espoo (FI)

( * ) Notice: Subject to any disclaimer, the term of this patent is extended or adjusted under 35 U.S.C. 154(b) by 0 days.

(21) Appl. No.: 18/707,001

(22) PCT Filed: Nov. 8, 2022

(86) PCT No.: PCT/EP2022/081081
§ 371 (c)(1),
(2) Date: May 2, 2024

(87) PCT Pub. No.: WO2023/088727
PCT Pub. Date: May 25, 2023

(65) Prior Publication Data
US 2024/0429917 A1      Dec. 26, 2024

(30) Foreign Application Priority Data

Nov. 16, 2021 (GB) ...................................... 2116517

(51) Int. Cl.
*H03K 17/68*   (2006.01)
*H03F 3/24*    (2006.01)
(Continued)

(52) U.S. Cl.
CPC .......... *H03K 17/687* (2013.01); *H03F 3/245* (2013.01); *H04B 1/0064* (2013.01); *H04B 1/44* (2013.01);
(Continued)

(58) Field of Classification Search
None
See application file for complete search history.

(56) References Cited

U.S. PATENT DOCUMENTS 1,017,983 A    2/1912   Long
5,212,408 A    5/1993   Even-Or
(Continued)

FOREIGN PATENT DOCUMENTS

CN    205545968 U    8/2016
CN    209545599      10/2019
(Continued)

OTHER PUBLICATIONS

PCT Written Opinion and Search Report issued in connection with related PCT/EP2022/081081 dated Feb. 8, 2023.
(Continued)

*Primary Examiner* — Pablo N Tran
(74) *Attorney, Agent, or Firm* — Cozen O'Connor

(57) ABSTRACT

An RF switching circuit for switching RF signals, the RF switching circuit comprises one or more RF switch drivers and one or more RF switches, the RF switch drivers configured to drive the one or more RF switches by supplying power to the one or more RF switches, the RF switch driver comprising an isolated gate driver comprising one or more inputs, one or more outputs, and electrical separation between the input circuitry and the output circuitry of the isolated gate driver, the RF switch driver configured to receive an input signal indicating when the one or more RF switches should be turned on and/or off, and to send in response an appropriate signal at the appropriate voltage to the one or more RF switches to turn them on or off according to the input signal.

21 Claims, 10 Drawing Sheets

(51) Int. Cl.
    *H03K 17/687*     (2006.01)
    *H04B 1/00*     (2006.01)
    *H04B 1/44*     (2006.01)

(52) U.S. Cl.
    CPC .. *H03F 2200/294* (2013.01); *H03F 2200/451* (2013.01)

(56) References Cited

U.S. PATENT DOCUMENTS

| | | | |
|---|---|---|---|
| 7,855,616 | B2 | 12/2010 | Lee et al. |
| 8,049,573 | B2 * | 11/2011 | Alfano ............... H01L 23/48 |
| | | | 375/258 |
| 8,963,618 | B2 * | 2/2015 | Keane ............... H03K 17/693 |
| | | | 327/437 |
| 9,379,604 | B2 * | 6/2016 | Zhong ............... H02M 3/07 |
| 10,498,230 | B1 * | 12/2019 | Chen ............... H02M 3/07 |
| 10,778,206 | B2 * | 9/2020 | Kolcuoglu ......... H03K 17/0406 |
| 10,931,193 | B2 * | 2/2021 | Tokuda ............... H03K 17/06 |
| 11,017,983 | B2 | 5/2021 | Mavretic |
| 11,121,713 | B1 * | 9/2021 | Bardsley ............ H03K 17/6872 |
| 2018/0026516 | A1 | 1/2018 | Ivanov |
| 2019/0026721 | A1 | 1/2019 | Khan et al. |

FOREIGN PATENT DOCUMENTS

| | | |
|---|---|---|
| JP | 2012-065041 A | 3/2012 |
| JP | 2018505602 A | 2/2018 |
| KR | 20100080571 A | 7/2010 |
| KR | 20170097216 A | 8/2017 |

OTHER PUBLICATIONS

Great Britain Office Action issued in connection with related Great Britain No. GB2116517.0 dated Apr. 22, 2023.
Great Britain Office Action issued in related Great Britain Patent Application No. 2116517.0 dated Nov. 2, 2023.
Great Britain Office Action issued in related Great Britain Patent Application No. 2116517.0 dated Jun. 7, 2024.
Korean Office Action issued in related Korean Patent Application No. 10-2024-7016053 dated Feb. 4, 2025.
Japanese Office Action issued in related Japanese Patent Application No. 2024-529255 dated Dec. 9, 2024.
Notice of refusal for Japanese patent application 2024-529255, dated Jul. 31, 2025 with translation.

\* cited by examiner

RADIO FREQUENCY SWITCH DRIVER

This application is the National Stage filing under 35 U.S.C. 371 of International Application No. PCT/EP2022/081081 filed on 8 Nov. 2022, which claims priority to GB Application No. 2116517.0 filed on 16 Nov. 2021, the contents of both of which are hereby incorporated by reference herein in their entirety to the extent permitted by law.

The present invention relates to a radio frequency (RF) switch driver, and an RF switching circuit for switching one or more antennas between receive and transmit modes. The invention also relates to a method of driving one or more RF switches, as well as a method for switching the state of one or more antennas.

BACKGROUND

Radio frequency (RF) switches, sometimes known as microwave switches, are used for routing high-frequency signals through many different types of circuits. RF switches can be electro-mechanical switches, or solid-state switches based on semi-conductor technology. Solid state switches function similarly to electro-mechanical switches but contain no moving parts. Instead, they may contain solid-state devices such as MOSFETS (Metal Oxide Semiconducting Field Effect Transistors) and/or PIN (positive-intrinsic-negative) diodes. PIN diodes comprise an area of intrinsic (I) or undoped semiconducting material sandwiched in between N-doped and P-doped regions. For high-frequency signals, they essentially act as variable-resistors, with the impedance depending on the bias applied. In the "off" state, the PIN diode essentially acts as an open circuit to a RF signal, whereas in the "on" state the PIN diode has a low impedance, sometimes as low as 1 Ohm, thereby allowing the high-frequency signal to be passed through. PIN diodes are well known in the art to be suitable for RF switches due these characteristics along with their relatively fast switching times relative to electro-mechanical switches.

RF switches can be used in conjunction with power amplifiers in various RF circuits. Power amplifiers (PAs) are used in a variety of applications to amplify RF signals delivered to electronic components. Such components may include but are not limited to antennas such as those used in satellite communications. Antennas may be phased array antennas, which comprise multiple antenna elements to allow for beam steering, for example. In antennas that are used for both transmitting and receiving signals, one amplifier might be dedicated to amplifying the transmit signal being sent to an antenna, and another amplifier such as a low-noise amplifier (LNA) may be used for amplifying the signal that is received by the same antenna.

RF frequencies typically refer to any signal than can be transmitted or received by an antenna, ranging from about 30 KHz to 300 GHZ, or even from 30 Hz to 300 GHz if ultra-low frequency radio waves are included.

Many PA boards for operating antennas that both transmit and receive RF signals utilize a common architecture, where the antenna is connected to an RF switch that commutes between the power amplifier (PA) and the low noise amplifier (LNA) during the transmit and receive phases respectively. An example is shown in UK patent application GB2578926A. The RF switch is controlled by applying voltages of different polarities to its inputs. As such, a RF switch driver circuit is required to apply the correct voltage to the inputs of the RF switch at the correct times. These RF switch driver circuits can be complicated, requiring many different components and multiple voltage sources. They also need to be able to drive the RF switch so that it switches very quickly while avoiding any short circuits in the RF switch. In some implementations the length of a regular transmit/receive (Tx/Rx) pulse for a given antenna circuit can be between 100 μs and 250 μs, which means the RF switch needs to switch between the PA and LNA very fast. Even with the use of PIN diodes, the combination of the RF switch driver and the RF switch can still be the slowest part of the whole switching circuit, with switching times of around 460 ns.

The embodiments of the invention described below are not limited to implementations which solve any or all of the disadvantages of the known approaches described above.

SUMMARY

This Summary is provided to introduce a selection of concepts in a simplified form that are further described below in the Detailed Description. This Summary is not intended to identify key features or essential features of the claimed subject matter, nor is it intended to be used to determine the scope of the claimed subject matter; variants and alternative features which facilitate the working of the invention and/or serve to achieve a substantially similar technical effect should be considered as falling into the scope of the invention disclosed herein.

In a first aspect, the present disclosure provides a RF switch driver for driving one or more RF switches by supplying power to the one or more RF switches, the RF switch driver comprising an isolated gate driver. Thus in one aspect an isolated gate driver is used in a context very different from the intended uses of isolated gate drivers.

The RF switch driver may be arranged to receive a periodic switching signal indicating when the one or more RF switches should be turned on and/or off, the RF switch driver also configured to send in response an output to the one or more RF switches at the appropriate voltage to turn them on or off based on the state of the input signal.

There is also provided here a method of supplying voltage and current to one or more RF switches to supply RF signals to one or more components, the method comprising driving the RF switches via an isolated gate driver arranged to receive a periodic switching signal.

There is also provided here a RF switching circuit comprising one or more RF switch drivers comprising an isolated gate driver and one or more RF switches.

The RF switching circuit my be configured for supplying signals to multiple components, the switching circuit and may comprise an RF switch driver comprising an isolated gate driver and being arranged to drive a plurality of RF switches arranged in parallel to switch RF signals to respective ones of the multiple components.

In a specific implementation of the switching circuit there is also provided here a system for switching one or more antennas between transmit and receive modes, the system comprising: a power amplifier and a low-noise amplifier for each antenna arranged to amplify RF signals during the transmit and receive modes of the antenna respectively; and the RF switching circuit which may comprise one or more RF switches for each antenna arranged to connect one of the amplifiers to the one or more antennas during the respective transmit or receive modes; first and second RF switch drivers each comprising an isolated gate driver connected to the one or more RF switches for driving the one or more RF switches during the respective transmit and receive modes.

Each RF switch driver may be connected to a plurality of RF switches.

The apparatus and methods described here utilise isolated gate drivers in a manner not previously contemplated. Isolated gate drivers have been used in high power applications, particularly where safety is of paramount importance and ensured by the isolation provided between low voltage control circuitry and high voltage output. Some of the implementations described below take advantage of other benefits provided by isolated gate drivers, such as the absence of a requirement for a predetermined supply voltage. For example there is no requirement to switch between 0V and ground.

In some implementations the RF switch driver circuit also can also drive a larger number of RF switches than hitherto, for example up to 100 or more RF switches. The RF switch driver circuit may also be space efficient, and/or require a minimum amount of components.

Optional features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which.

Figure 1:
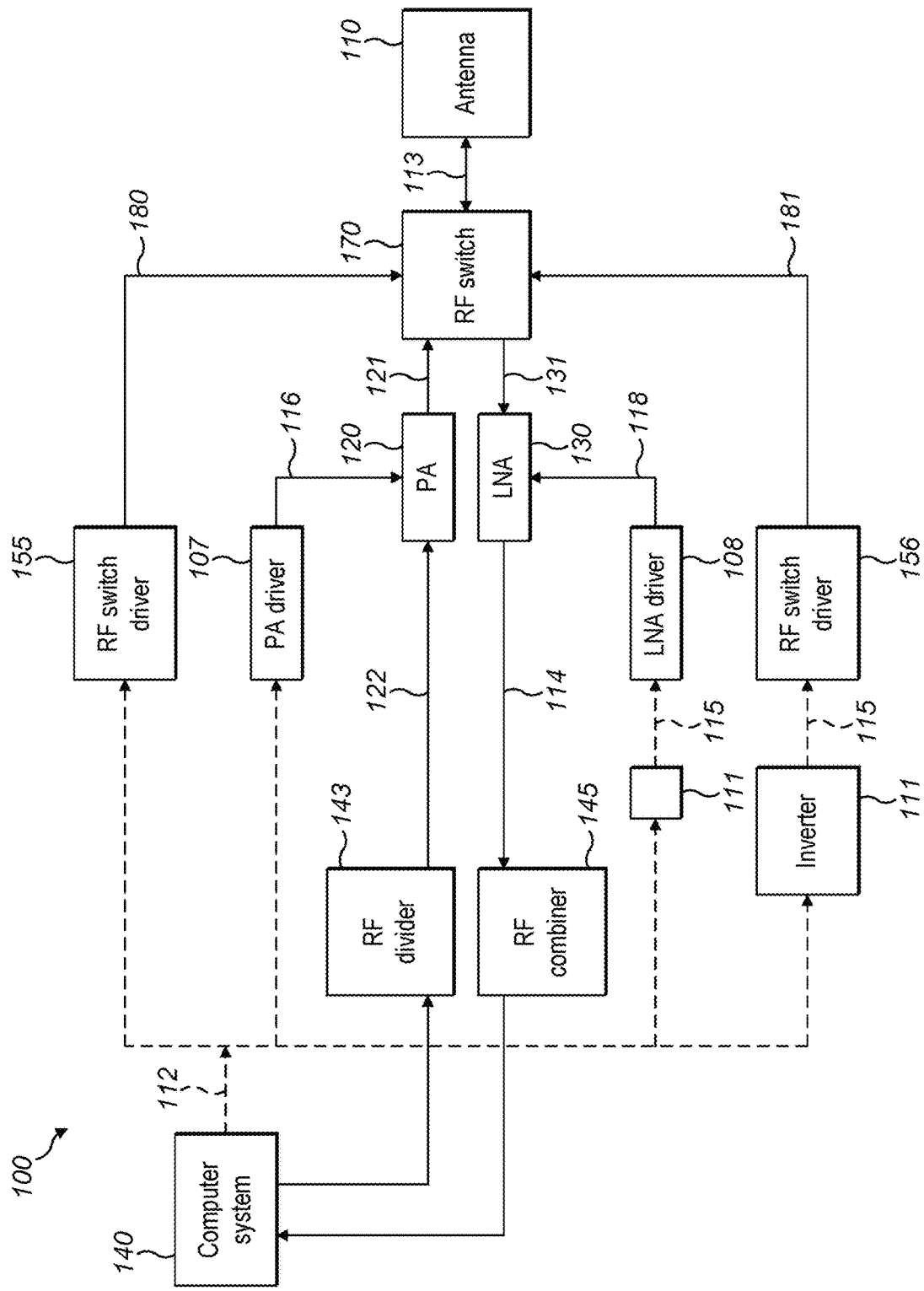
FIG. 1 is a schematic diagram of a system for switching an antenna between transmission and reception modes, according to some embodiments of the invention.

Common reference numerals are used throughout the figures to indicate similar features.

DETAILED DESCRIPTION

Embodiments of the present invention are described below by way of example only. These examples represent the best mode of putting the invention into practice that are currently known to the applicant although they are not the only ways in which this could be achieved. The description sets forth the functions of the example and the sequence of steps for constructing and operating the example.

Some embodiments of the invention comprise an RF switch driver to drive one or more RF switches being used to switch RF signals to and from an antenna on a satellite, and a method of supplying power to an RF switch. The signal from the RF switch driver to the RF switch is not inherently an RF signal itself, but in some examples where the RF switch is required to operate at high frequency, it may itself operate at frequencies high enough to be in the radio frequency range. Antennas are used on satellites in a variety of situations including for communications for imaging the earth using synthetic aperture radar. An example situation is described with reference to FIG. 1 for an apparatus on a satellite according to some embodiments of the invention. The same principles of construction and operation used in this example are applicable in other RF switching applications and situations.

Common reference numerals are used throughout the figures to indicate similar features. It should be noted that such features are not particular to satellites or satellite operation and may be generic to RF switching in general unless otherwise stated.

FIG. 1 shows a schematic of a system 100 for switching an antenna 110 between transmission and reception modes, according to some embodiments of the invention. Heavier solid arrows between components are used to indicate RF signal connections, lighter solid arrows are used to indicate power connections, and dotted arrows are used to indicate data connections. In practice, the system 100 and antenna 110 may be located on a satellite, although a similar system could also be used on an airplane, on a ship, a land vehicle, or in a static location on the ground.

The components shown in FIG. 1 include a first RF switch driver 155, and a second RF switch driver 156, each having outputs connected to terminals on an RF switch 170. In an example, RF Switch 170 is a single-pole-double-throw (SPDT) switch that switches between a transmit mode whereby RF signal 121 is sent via signal path 113 to the antenna 110, and a receive mode during which a signal received from the antenna 110 is sent to a low-noise amplifier (LNA) 130 via signal path 131. A control signal 112 (e.g., a transmit/receive pulse train) from a computer system 140 indicates to the circuit when to transmit to the antenna 110, and when to receive from the antenna 110. The RF switch driver 155 provides a power signal 180 to the RF switch 170, and the RF switch driver 156 provides a power signal 181 to the RF switch 170. Inverter 111 inverts the control signal so that when RF Switch Driver 155 receives a signal to turn on one side of the RF Switch 170 (e.g., for transmit mode), RF Switch Driver 165 receives the opposite (inverted) signal to turn its side of the RF Switch 170 off (e.g., for receive mode), and vice versa.

Other components shown in FIG. 1 include a power amplifier (PA) 120 and the low noise amplifier (LNA) 130 connected to the RF switch 170. The PA 120 is used for amplifying the RF signal 122 from an RF divider 143 that is used when the antenna 110 is in transmit mode. The LNA 130 is used for amplifying the RF signal 131 from the antenna 110 during the receive mode. Once amplified, the LNA 130 outputs the received signal 114 to the RF combiner 145 for further signal processing (not shown). The PA 120 is driven by a power amplifier (PA) driver 107, and the LNA 130 is driven by a LNA driver 108. The PA driver 107 has output 116 to the PA 120, and the LNA drive circuit 108 has output 118 to the LNA 130. In some embodiments, the PA drive circuit 107 may be identical to the LNA drive circuit 108. The RF switch 170 comprises two separate solid state switches (not shown), one for conducting the RF signal 121 from the PA 120 to the antenna 110, and one for conducting the RF signal 113 from the antenna 110 back to the LNA 130.

The system 100 additionally comprises a second inverter 111. The purpose of the inverters 111 is to invert the control signal 112 from the computer system 140 for the RF switch driver 156 (signal 115) and the LNA driver 108 (signal 115), relative to the signal output to the RF switch driver 155 and the PA 120. However, it can be appreciated that the inverter 111 could be instead placed before the RF switch driver 155. Note that FIG. 1 excludes timing and delay components (e.g. dead-time generators) that can be used in such a system 100.

In an example, the antenna is carried by a satellite in low-earth orbit as part of a synthetic aperture radar system used for Earth imaging. In such a system, the transmit/receive pulse can be quite short, and faster switching between each cycle is preferred. For example, the length of a regular transmit and receive cycle can be between 100 µs and 250 µs.

In an example, the antenna 110 is an antenna for transmitting and receiving such synthetic aperture radio (SAR) waves for the purpose of imaging the Earth. X-band radio waves between 8 GHz and 12 GHz can be used for such a purpose. SAR imaging can also be carried out using C band (4-8 GHZ) frequencies, S-band (2-4 GHZ) frequencies, L-band (1-2 GHZ) frequencies, and P-band (0.3-1 GHZ) frequencies. In general, SAR imaging can be performed with frequencies ranging from 300 MHz to 300 GHZ.

The term 'computer system' is used herein to refer to any device or group of devices with processing capability such that it/they can execute instructions. Those skilled in the art will realise that such processing capabilities may be incorporated into many different devices and therefore the term 'computer system' as used herein may include personal computers, servers, mobile communication devices and many other devices.

The satellite may include one or more RF antennas 110, for example radar antennas, which may be located at one or more wings 106. Each antenna or each antenna element 110 may have an associated PA 120 and LNA 130, supplied with power via the amplifier driver circuits 107 and 108.

Figure 2:
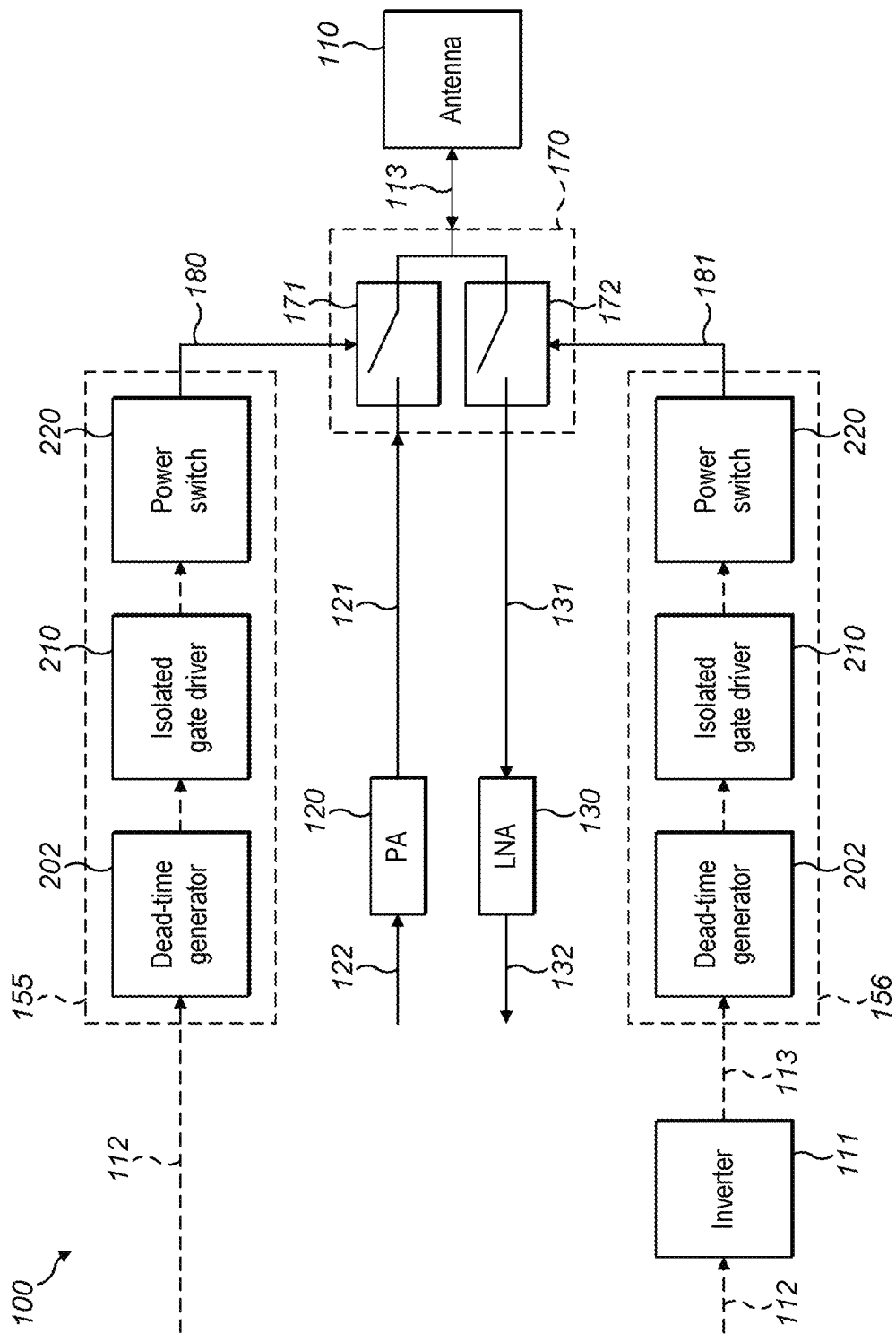
FIG. 2 is schematic diagram of two RF switch drivers connected to RF switches, according to an embodiment of the present invention.

FIG. 2 is a schematic block diagram illustrating the RF switch driver circuits 155 and 156 of the system 100 (identical to the circuits 107 and 108 in FIG. 1) according to some embodiments of the invention. It can be seen that each RF switch 155 and 156 comprises three components arranged in series: a dead-time generator 202, and isolated gate driver 210, and a power switch 220. It can also be seen that the RF switch 170 comprises two switches 171, and 172. In an example, the switch 170 is a single-pole-double-throw (SPDT) switch. Switch 171 receives a power signal 180 from the power switch 220 of the RF switch driver 155, and switch 172 receives a power signal 181 from the power switch 220 of the RF switch driver 156.

Referring back to FIG. 1, the antenna 110 can only be either in transmit mode or the receive mode at any given time. In the transmit (or transmission) mode, the computer system 140 sends an "on" signal to RF switch driver 155, as well as PA driver 107. PA driver 107 turns on the PA 120 and the RF switch driver 155 drives (i.e. turns "on") RF switch 170 so that RF signal 121 is passed by the RF switch 170 to the antenna 110 via RF signal 113. Inverters 111 invert the signal so that RF switch driver 156 and LNA driver 108 receive an "off" signal, while the RF switch driver 155 and PA driver 107 receive the "on" signal. In this case, the RF switch 170 does not pass the signal 113 from the antenna 110 to the LNA 130.

During the receive (reception) mode, the computer system 140 sends an "on" signal to RF switch driver 156, as well as PA driver 107. LNA driver 108 turns on the LNA 130 and the RF switch driver 156 drives (i.e. turns "on") RF switch 170 so that RF signal 113 is passed by the RF switch 170 through to the LNA 130 via RF signal 131. Since the signal 115 received by the LNA driver 108 and the RF switch 156 is inverted, the RF switch driver 155 and LNA driver 107 receive an "off" signal. In this case, the RF switch 170 does not pass the signal 121 from the PA 120 to the antenna 110. Thus, during a full transmit/receive pulse, the antenna 110 switches between a transmit mode and the receive mode (or vice versa), and this cycle repeats with the next transmit/receive signal.

The function of the dead-time generator 202 is to generate dead time for switching between transmit and receive phases of the antenna 110, such that a short-circuit path through the RF switch 170 circuit is prevented, as will be detailed below.

Isolated gate drivers 210 are well-known in the art for use in power supply circuits and motor drives. In these applications, isolated gate drivers are used to provide the voltage and drive current required to turn the power switches used in these circuits on and off. For example, they can be used to apply the appropriate voltage and drive current to the gate of power transistors such as IGBTs (Insulated Gate Bipolar Transistors), and power MOSFETS (Metal Oxide Semiconducting Field Effect Transistors). One example of an isolated gate driver is the model UCC21520AQDWRQ1 from Texas Instruments. The CC21520AQDWRQ1 model is 2-channel isolated gate driver with dual input, disable, deadtime and 8V UVLO (Under Voltage Lock Out). An isolated gate driver usually comprises one or more inputs, one or more outputs, and electrical separation between the input circuitry and the output circuitry of the isolated gate driver. Isolated gate drivers have been designed to operate high power and/or high voltage transistors, such as those seen in high power convertors and electric motors.

Isolation in electrical circuits refers to the separation of the different functional sections of a circuit so there is no direct conductive electrical connection between them. For example, it can be important for safety reasons to electrically separate the high-voltage side of a power supply circuit and the low-voltage control circuitry where human intervention may be required. The various parts of the circuit can still be connected and communicate between each other through capacitive, inductive, or optical means. Although RF signals used in the present invention are not necessarily powerful enough or high enough voltage to require the use of isolated gate drivers, integrating an isolated gate driver inside the RF switch drivers can provide several surprising advantages. For example, the RF switch driver is able to switch between two arbitrary voltages, thereby allowing use with a wide variety of RF switches, whilst maintaining very good switching times. In the absence of such a gate driver, the RF switch driver always switches between 0 V (ground) and some other arbitrary voltage.

Since isolated gate drivers are typically rated for much higher power and current than what would normally be required for switching RF switches, it would not be obvious to use them as such. However, the higher power capability can actually be an advantage in RF applications, where a single RF switch driver can be used to drive multiple switches. This configuration can be very useful, for example, in phased-array antennas, when a separate RF switch is required for each antenna phase/patch element, and the timing is such that many of them can be driven using a single RF switch driver.

Figure 3:
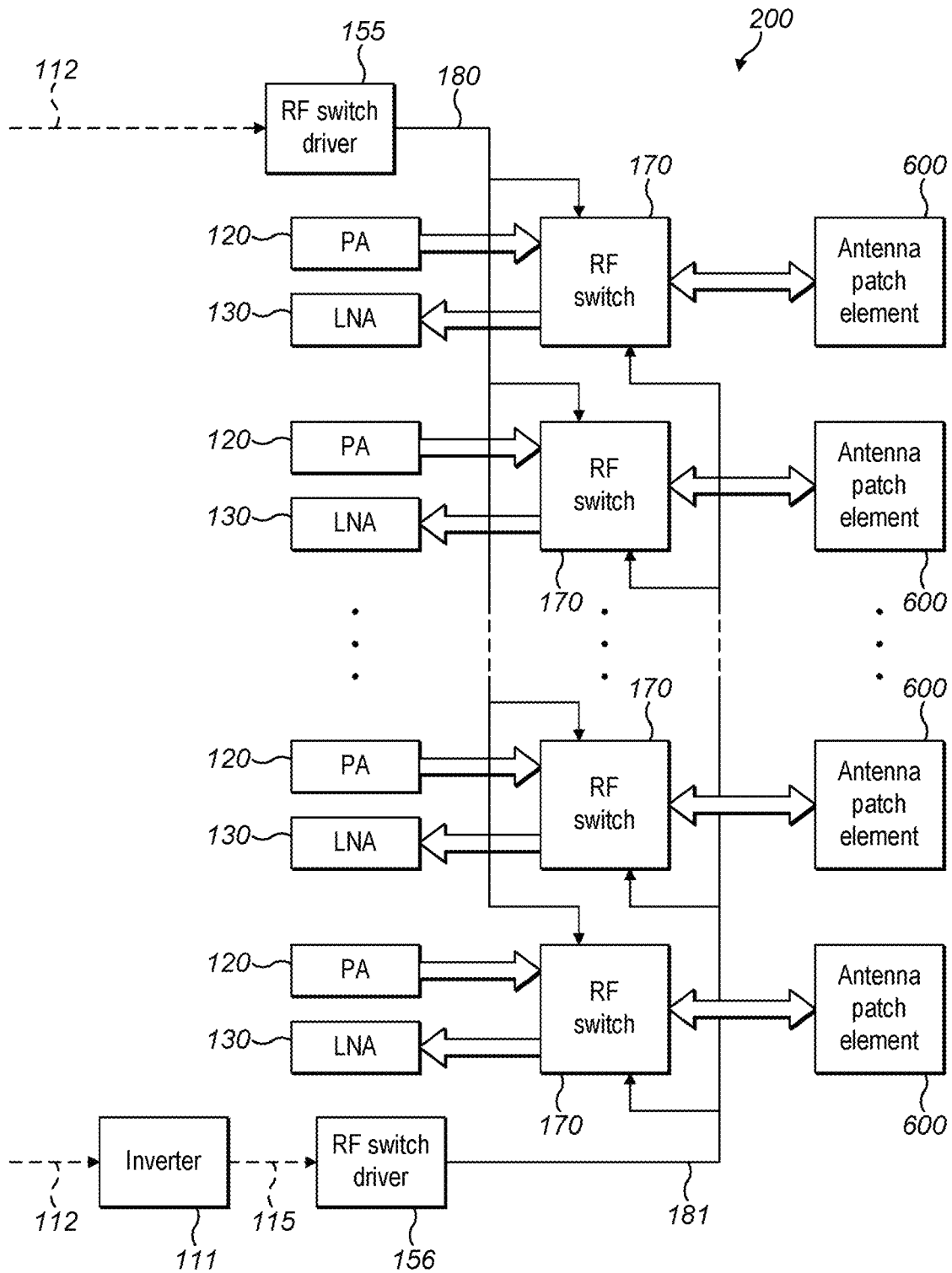
FIG. 3 is a schematic diagram of a system for switching the mode of a plurality of antennas between transmission and reception, according to some embodiments of the invention.

A schematic of such a system 200 is shown in FIG. 3, where it can be seen that a pair of RF switch drivers (155 and 156 in FIGS. 1 and 2 for transmit and receive mode respectively) is able to drive multiple RF switches 170, and where each RF switch 170 is connected to one antenna patch element 600 Using isolated gate drivers 210 in the RF switch drivers 155 and 156, allows 100 or more RF switches 170 to be driven by just one pair of RF switch drivers 155 and 156.

Figure 4:
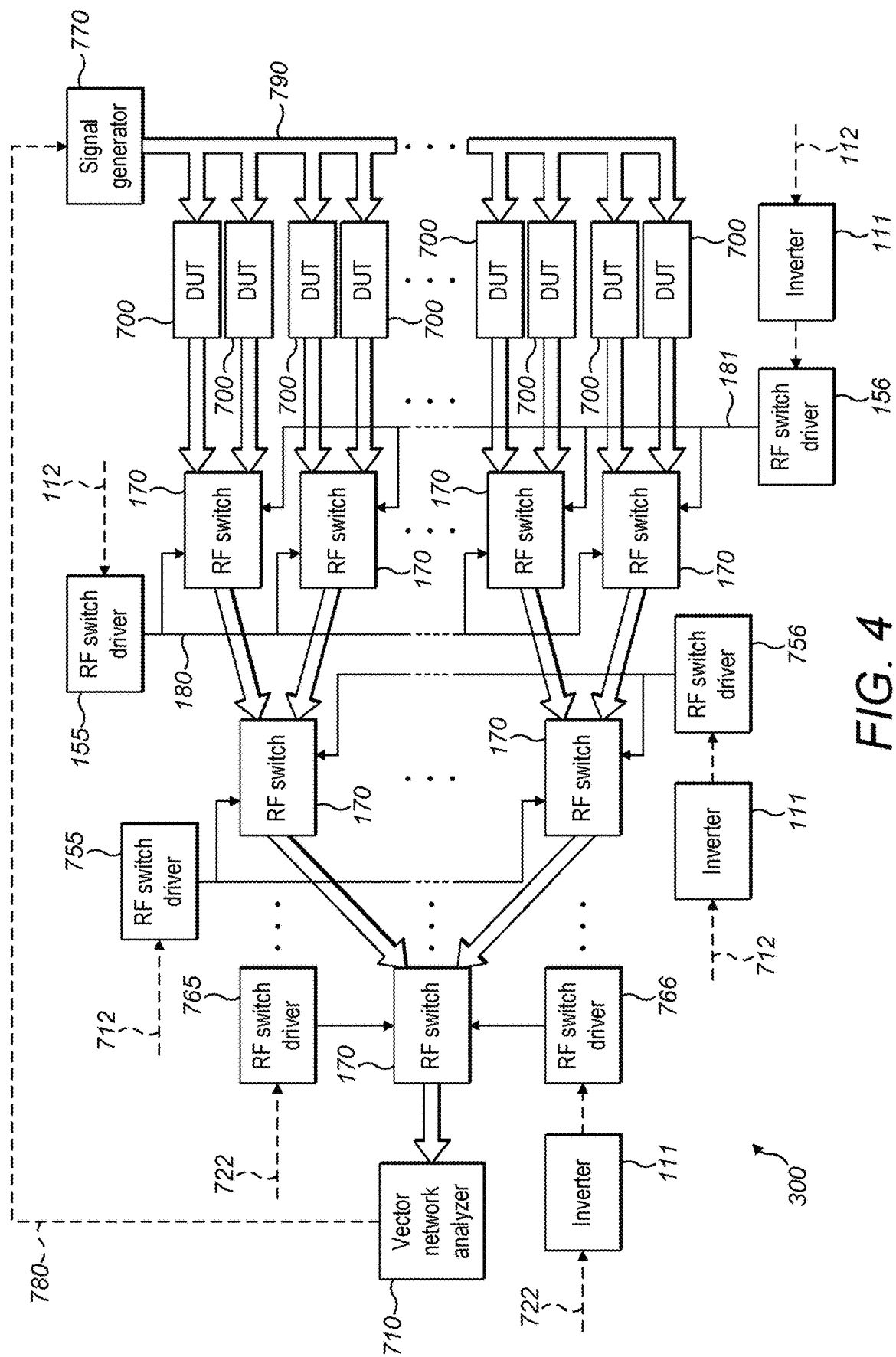
FIG. 4 is a schematic diagram of a system using a plurality RF switch drivers in conjunction with RF switches for RF test automation.

In an example of another embodiment, RF switch drivers 155 and 156 can be used to drive RF switches in applications involving automated testing of high frequency RF components, as shown in the system 300 of FIG. 4. This figure shows an example of a system for supplying as well as collecting and analyzing RF signals to and from multiple devices under test (DUT). Such a system could be used in R&D, product development, or quality control, for example. System 300 comprises multiple RF switch drivers as described here, arranged to drive a plurality of RF switches arranged in parallel to collect signals from respective ones of the multiple components, in this example devices under test. Multiple devices can be simultaneously tested, with the output of each device under test 700 (DUT) being connected to a the input of a test device, such as that of a VNA (Vector Network Analyzer) 710.

In the example of FIG. 4, a Vector Network Analyzer 710 is used to analyse RF frequency signals from multiple devices under test (DUT) 700. Vector Network Analyzer 710 supplies a test signal 790 via a signal generator 770 to one or more DUTs 700. The signal generator 770 is shown in this example as a separate instrument from the Vector Network Analyzer 710, but could also be incorporated into the Vector Network Analyzer 710. RF switch drivers 155 and 156 controlled by control signal 112 are used to select between pairs of DUTs 700 via RF switches 170. In this example, RF switch 170s can be SPDT switches. In other examples of similar applications, the RF switches could be other types of RF switches such as single pole single throw (SPST) RF switches or double pole double throw (DPDT) RF switches. In an example the RF switches 170 can be RF PIN diode switches.

RF switch drivers 755 and 756 are controlled by control signal 712 and further select between groups of DUTs by switching other RF switches 170. RF switch drivers 765 and 766 are controlled by control signal 722 and performs the final selection via another RF switch 170 prior to the signal from the chosen DUT 700 being fed into the Vector Network Analyzer 710. In this way, multiple DUTs 700 can be connected and analysed by a single Vector Network Analyzer 710 without having to disconnect one DUT 700 and connect another DUT to the Vector Network Analyzer 710. Control signals 112, 712, and 722 can come from a computer (not shown) to control and select which DUT 700 is being tested at a given time. The system 300 can sequentially test each DUT 700, by sending the appropriate control signals to the RF switch drivers 155, 156, 755, 756, 765, and 766. Alternatively, system 300 can cycle through each of the DUTs 700 repeatedly, dedicating a "time slice" for testing each DUT 700. The system 300 can have the advantage of allowing for easier comparison of the output signals of multiple DUTs 700, and of identifying outliers or non-conforming DUTs. In this example, 8 DUTs are shown under test, but it can be appreciated that more (or also fewer) DUTs could be attached in a similar manner (as indicated by the three vertical dots), and that additional RF switches and RF switch drivers could be added in a similar manner (as indicated by the three horizontal dots) to suit the number of DUTs being tested.

Using different types of RF switches (e.g., DPDT) for RF switch 170, it can also be possible to combine signals from multiple DUTs 700 rather than selecting only a single DUT. Even though not designed for use in RF circuits, RF switch drivers comprising isolated gate drivers can also have the advantage of improving isolation on RF boards. This has the possible advantage of reducing noise on the RF boards, which can help with signal quality. Other RF applications benefitting from the use of a RF switch driver comprising an isolated gate driver may become apparent to those skilled in the art.

Figure 5:
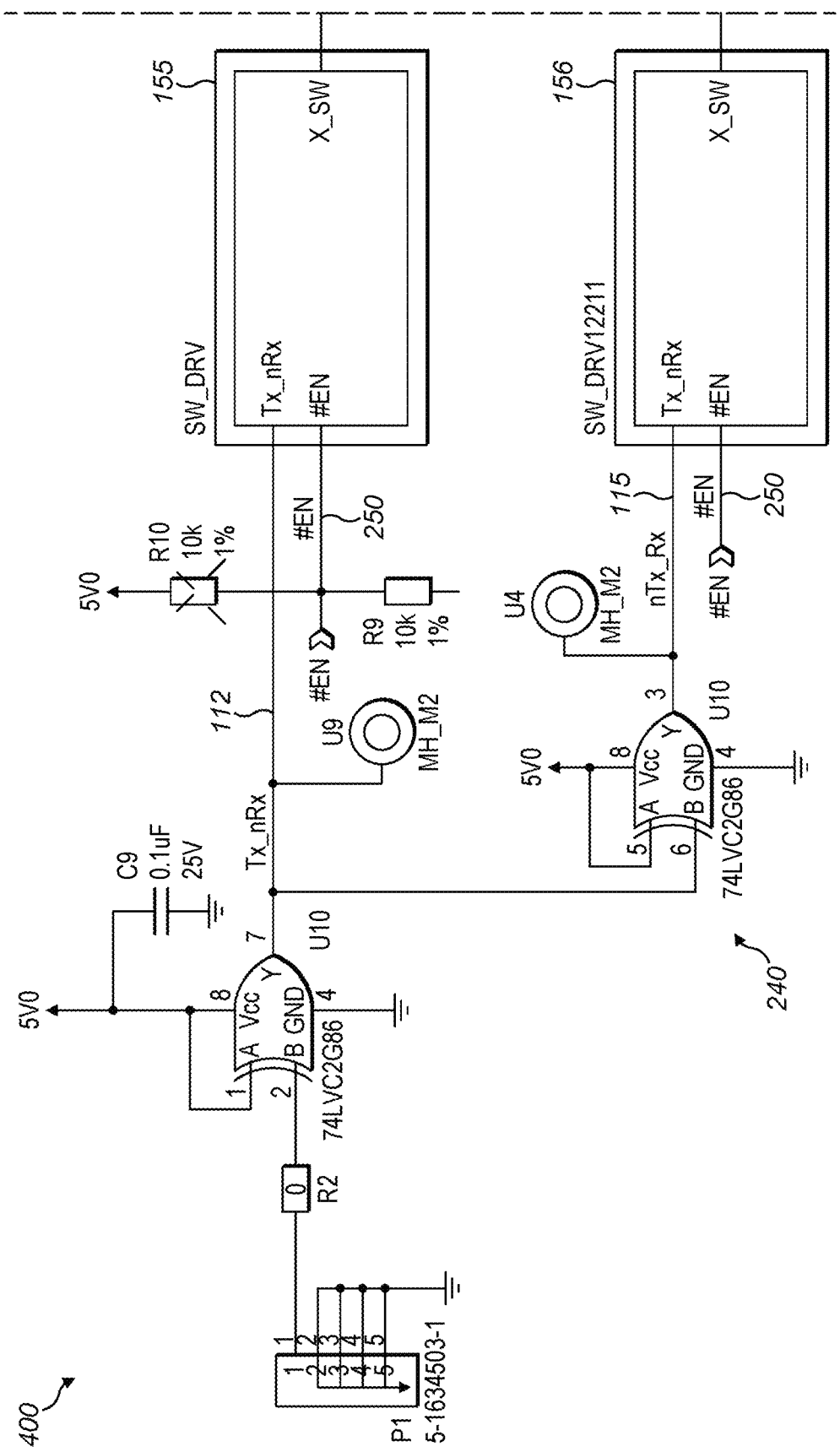
FIG. 5 is an electrical circuit diagram of the system of FIG. 1, according to some embodiments of the invention.
Figure 5:
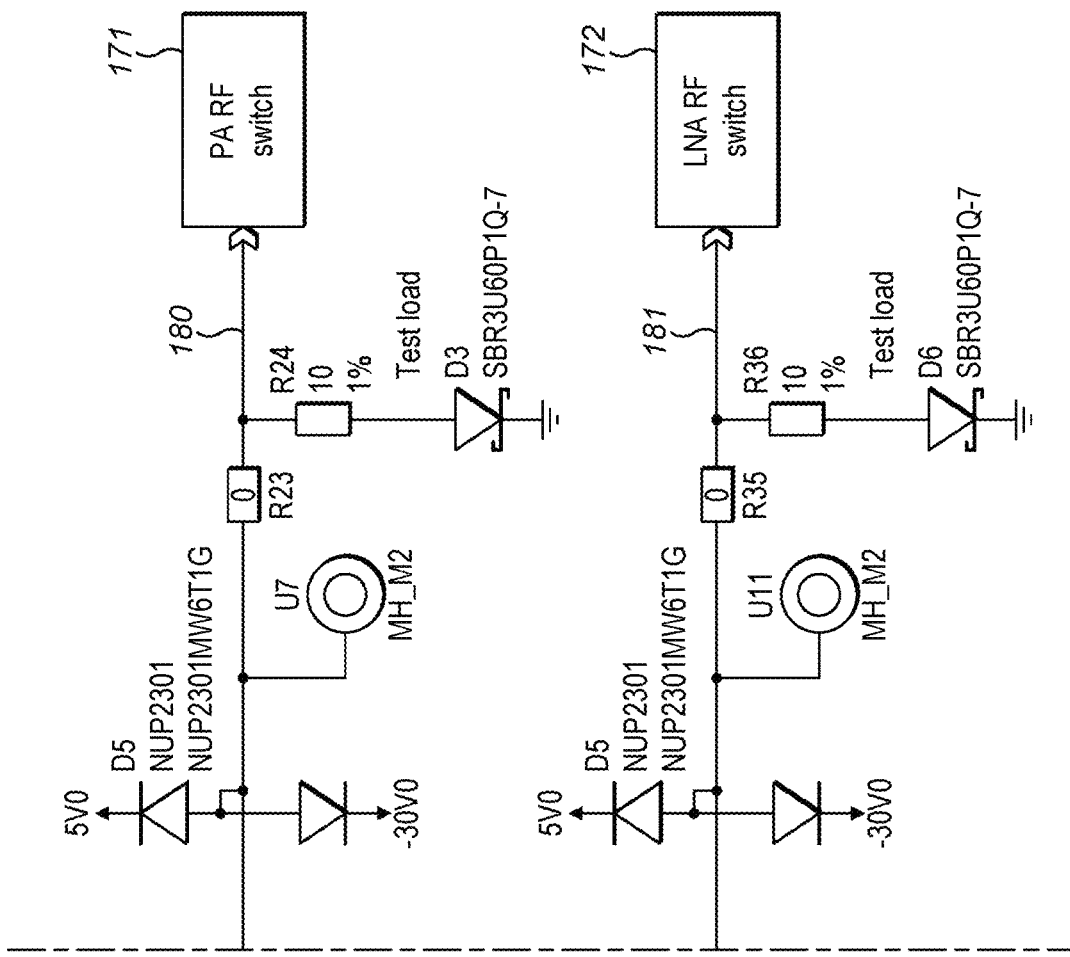

FIG. 5 shows an electrical circuit diagram 400 of some components of the system 100 shown in FIG. 1. As can be seen, the input signal 112 (from the computer system 140) is split between the RF switch drivers 155 and 156. However, before reaching the RF switch driver 156, the signal 122 is inverted relative to the signal 122 reaching the RF switch diver 155. In an embodiment, inversion is achieved using an XOR gate 240 as shown performing the function of an inverter 111 of FIGS. 1 and 2. Both RF switch drivers 155 and 156 also receive an Enable (EN) signal 250. As before, the output 180 of the RF switch driver is received by the RF switch 171 that is connected to the PA 120. Similarly, the output 181 of the RF switch driver 156 is received by the RF switch 172 that is connected to the LNA 130.

Figure 6:
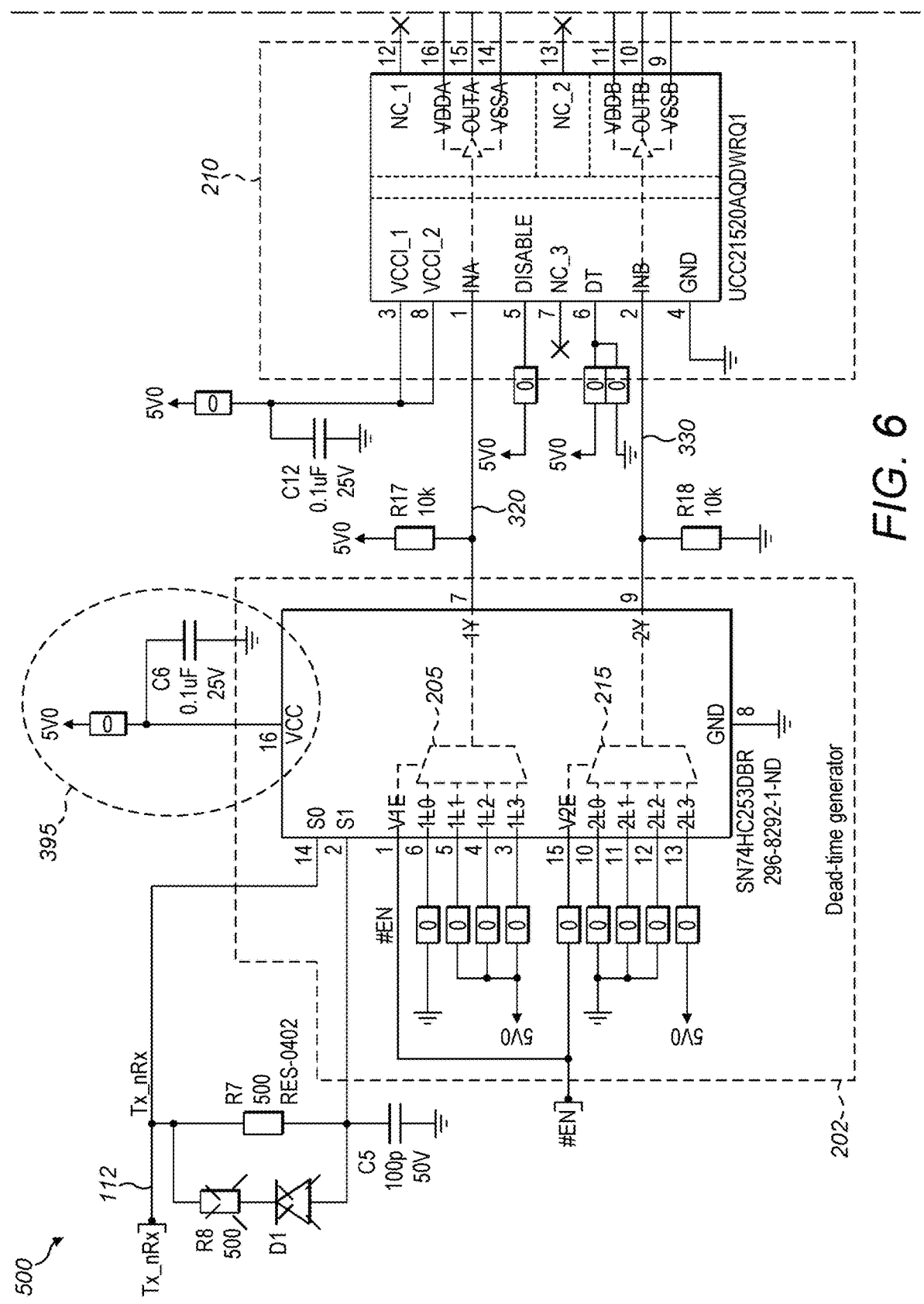
FIG. 6 is an electrical circuit diagram of an RF switch driver circuit, according to some embodiments of the invention.
Figure 6:
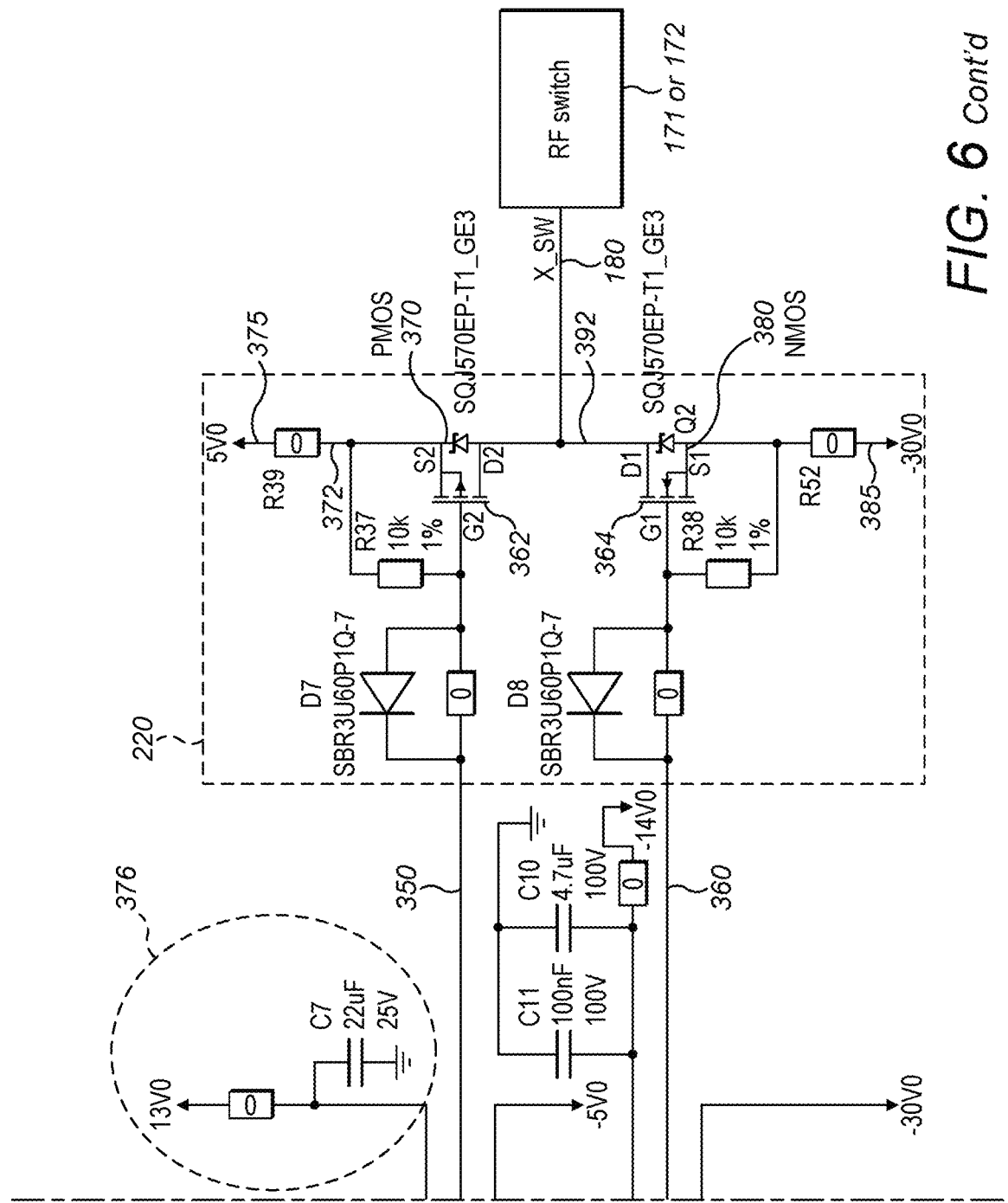

FIG. 6 shows an electrical circuit diagram 500 of the RF switch drivers 155 and 156 shown in FIGS. 1 and 2. As can be seen, the circuit 500 comprises an isolated gate driver 210 with outputs connected to the power switch 220, and an adjustable dead-time generator 202 with outputs connected to the isolated gate driver 210.

In this example, the adjustable dead-time generator 202 is a dual 4-to-1 multiplexer, comprising a first multiplexer 205 and a second multiplexer 215. The dead-time generator 202 has two outputs 320, 330 which are input to the isolated gate driver 210. The output 320 is connected to four input pins labelled 1L0-L3 (i.e. of the first multiplexer 205) of the dead-time generator 202. The 1L0 pin is connected to the ground, whereas pins 1L1-3 are connected to a finite voltage (e.g. 5 V). The output 330 is connected to four input pins labelled 2L0-3 (i.e. of the second multiplexer 205). However, pins 2L0-2 are connected to ground, and pin 2L3 is connected to a finite voltage (e.g. 5V). The isolated gate driver 210 also has outputs 350 and 360. The outputs 350 and 360 correspond to the outputs 320, 330 of the dead-time generator 202. This means, for example, if the output 320 is state (or bit) 1, the output 350 will also be state 1.

In an embodiment, the output 350 is applied to a gate 362 of a P-channel MOSFET (PMOS) 370. Similarly, the output 360 is applied to a gate 364 of an N-channel MOSFET (NMOS) 380. The PMOS transistor 370 requires a constant voltage applied to its gate 362 (for an indefinite amount of time). This is enabled by the inclusion of an RF circuit 376, which is connected to pin 16 of the isolated gate driver 210, as shown in FIG. 6. It can be appreciated, however, that other type of transistors may also be used.

The source terminal 375 of the transistor 370 is connected to a +5 V power supply, and the source terminal 385 of transistor 380 is connected to a −30 V power supply. As mentioned previously, the use of an isolated gate driver in this configuration allows almost arbitrary selection of voltages at the source terminals 375, 385 (within safe operating limits of the system 500). In an embodiment, −30V and +5V are used. However, it can be appreciated that almost any selection of voltages may be used. This allows the isolated to driver 210 to drive different RF switches with different operating voltage ranges (e.g., in the example the voltage range is 35 V, which is the difference between +5 V and −30 V). Using the isolated gate driver in this manner provides numerous additional and unexpected advantages, such as greater efficiency with less heat dissipation, the potential of an order of magnitude faster switching compared to prior art, and using a minimum of components.

The transistors 370, 380 form a pair of switches arranged in series between power sources of different voltages. The transistors share a common drain terminal 392, forming a complementary transistor circuit or switch 220. The output 180 of the switch 220 is input to either RF switches 171 or 172 (see FIG. 2).

Figure 7:
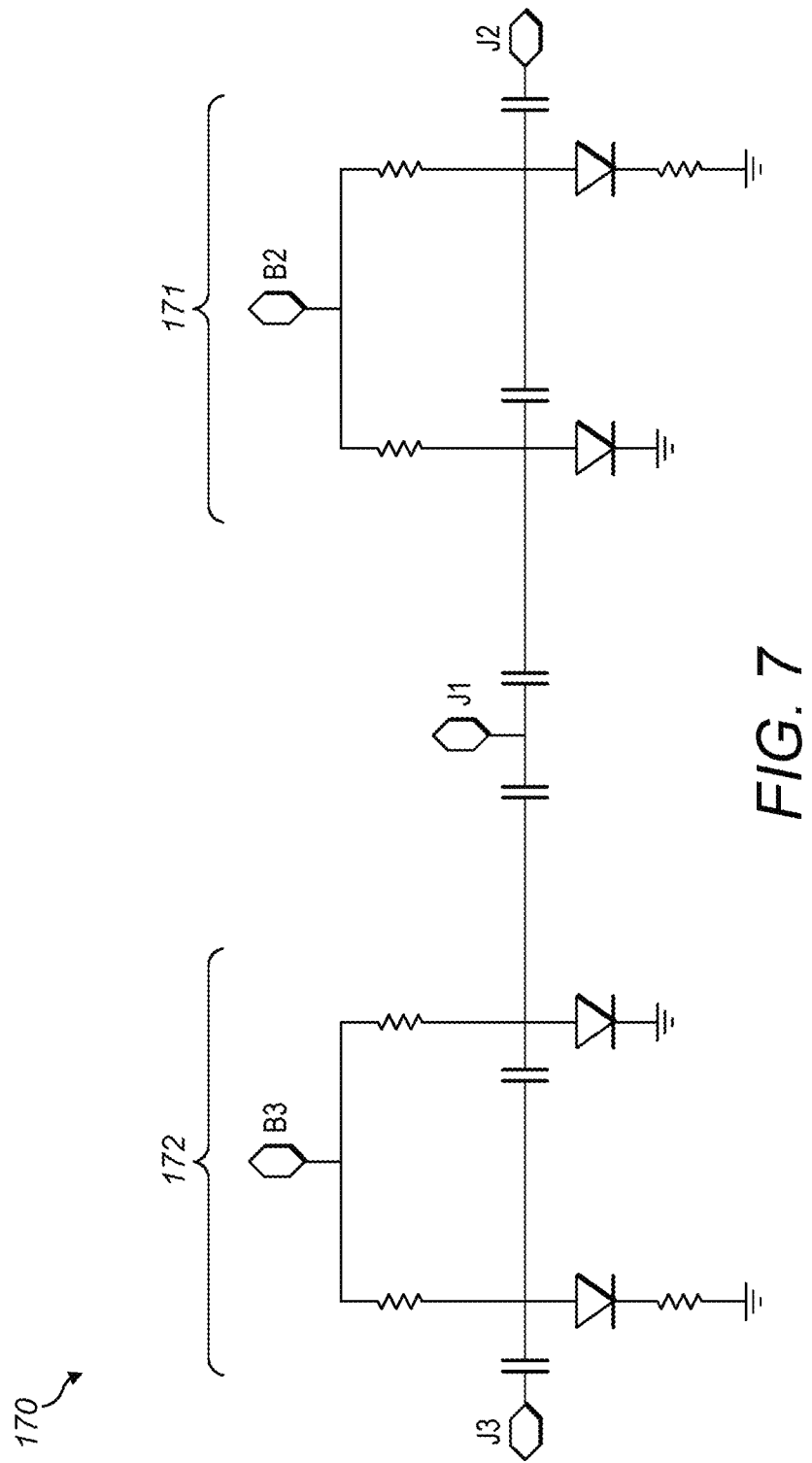
FIG. 7 is an electrical circuit diagram of a prior art RF switch.

FIG. 7 shows a simplified functional diagram of an example of a RF switch 170. In this diagram, J1, J2, and J3 are RF inputs/outputs and B3 and B2 are control pins. Referring also to FIG. 2, in one example, J1 is connected to antenna 110, J2 is connected to PA 120, and J3 is connected to LNA 130. B2 is connected to RF switch driver 155, and B3 is connected to RF switch driver 156. The switch 170 is driven (i.e. switched "on" and "off") by receiving the appropriate voltage signal, for example, −30 V (for turning the switch "on"), and +5 V (for turning the switch "off") from the RF switch drivers 155 and 156. An example of such an RF switch is model MASW-011071 from Macom, of Massachusetts, USA. The MASW-011071 is a silicon PIN diode SPDT (Single Pole Double Throw) RF switch designed for high-performance X-Band RF applications. The switch 170 is designed for up to about 20 W of transmitted power.

During operation of the system 100, the dead-time generator 202 receives a periodic switching signal (e.g. transmit/receive pulse) 172, which comprises signals S0 and S1. These signals form the select line inputs of the dead-time generator 202. Table one below shows the truth table for the dead-time generator 202 of the present invention for a single transmit/receive pulse:

TABLE ONE

| Transmit/receive pulse state | S0 state | S1 state | Selected Input pin | Output 320 | Output 330 | PMOS state | NMOS state |
|---|---|---|---|---|---|---|---|
| 0 | 0 | 0 | L0 | 0 | 0 | 1 | 0 |
| 0 → 1 | 1 | 0 | L1 | 1 | 0 | 0 | 0 |
| 1 | 1 | 1 | L3 | 1 | 1 | 0 | 1 |
| 1 → 0 | 0 | 1 | L2 | 1 | 0 | 0 | 0 |

Thus, depending on the state of select line inputs S0S1, the dead-time generator 202 selectively couples one of the four input pins (L0-L3) to the outputs 320, 330, as shown in the table. For example, and referring also to FIGS. 1 and 6, when the select line inputs are S0S1=00 at time t=0 (corresponding to the transmit/receive pulse 172 in state 0 according to table one), pin L0 for both the first 205 and the second 215 multiplexers is selected. This means that the outputs 320, 330 of the dead-time generator 202 are both 0 V, since pins 1L0 and 2L0 are both connected to the ground. Therefore, this will activate transistor 370 (as this is a PMOS transistor), and transistor 380 will remain deactivated. Since the source terminal 375 of the transistor 370 is connected to a +5 V power supply, the output of the system 500 (i.e. RF switch driver 155 or 156) will be +5 V. In this case, the system 500 will switch the RF switch (171 or 172 in FIG. 2, depending on which switch is connected to the RF switch driver) to the "off" state, such that no signal can pass via the RF switch 171 or 172.

Subsequently, the S0 state will go to state 1, while S1 remains in the 0 state (which corresponds to a transitioning state 0→1 of the transmit/receive pulse 172). This combination will select the 1L1 and 2L1 pins, which means the output 320 will be state 1, while output 330 will remain in state 0. This means that the output 180 of the system 500 will be zero volts, since none of the transistors 370, 380 are activated. As can also be seen in FIG. 4, the dead-time generator 202 is connected to an RC circuit 395. The result is that the outputs 320, 330 will remain in the S0S1=10 for the brief period of time state (i.e., both transistors 370, 380 deactivated), before transitioning to the next phase. This delay is approximately equal to the RC constant of the circuit 395. In one embodiment, the RC constant is 50 ns. However, it may be appreciated that different RC time constants can be chosen by selecting the appropriate capacitance and the resistance in the RC circuit 395. In this case, the RF switch 171 or 172 will remain in the "off" state.

After the brief delay, S1 also goes to state 1, thus S0S1=11 (state 1 of transmit/receive pulse 172), and so outputs 320, 330 are both equal to 1, since pins 1L3 and 2L3 are now selected according to table one. This means that transistor 370 is now deactivated, and the transistor 380 is activated such that the output of the system 500 is −30 V. As a result, the system will switch the RF switch 171 or 172 to the "on" state, such a signal can pass via the RF switch 171 or 172. Referring to FIG. 2, if the system 500 is connected to the RF switch 171, then the antenna 110 will switch to the transmission mode (RF switch 172 will be "off" due to the inverter 111), and if the system 500 is connected to the RF switch 172, then the antenna 110 will switch to the reception mode (RF switch 171 will be "off" due to the inverter 111).

Thus, it can be seen is that the purpose of the dead-time generator 202 is to generate dead time between the switching of the two switches 171 and 172, such that RF switches 171 and 172 do not become "on" at the same time. In the latter situation, there would be a short circuit through the RF switch 170 from the power amplifier 120 to the low-noise amplifier 130. This, in addition to damaging the RF switch 170, could also result in the damage of the low-noise amplifier 130.

Finally, S0S1 goes to state 01, selecting pins 1L2 and 2L2 (transmit/receive 172 pulse transition from 1→0). Here, the output 320 is equal to 1, and output 330 is equal to 0, such that none of the transistors 370, 380 are activated. As a result of the RC circuit 295 of the dead-time generator 202, the circuit 500 will remain in this state for a brief period of time, before repeating the whole cycle again when a new transmit/receive signal 172 is received by the dead-time generator 202.

Figure 8:
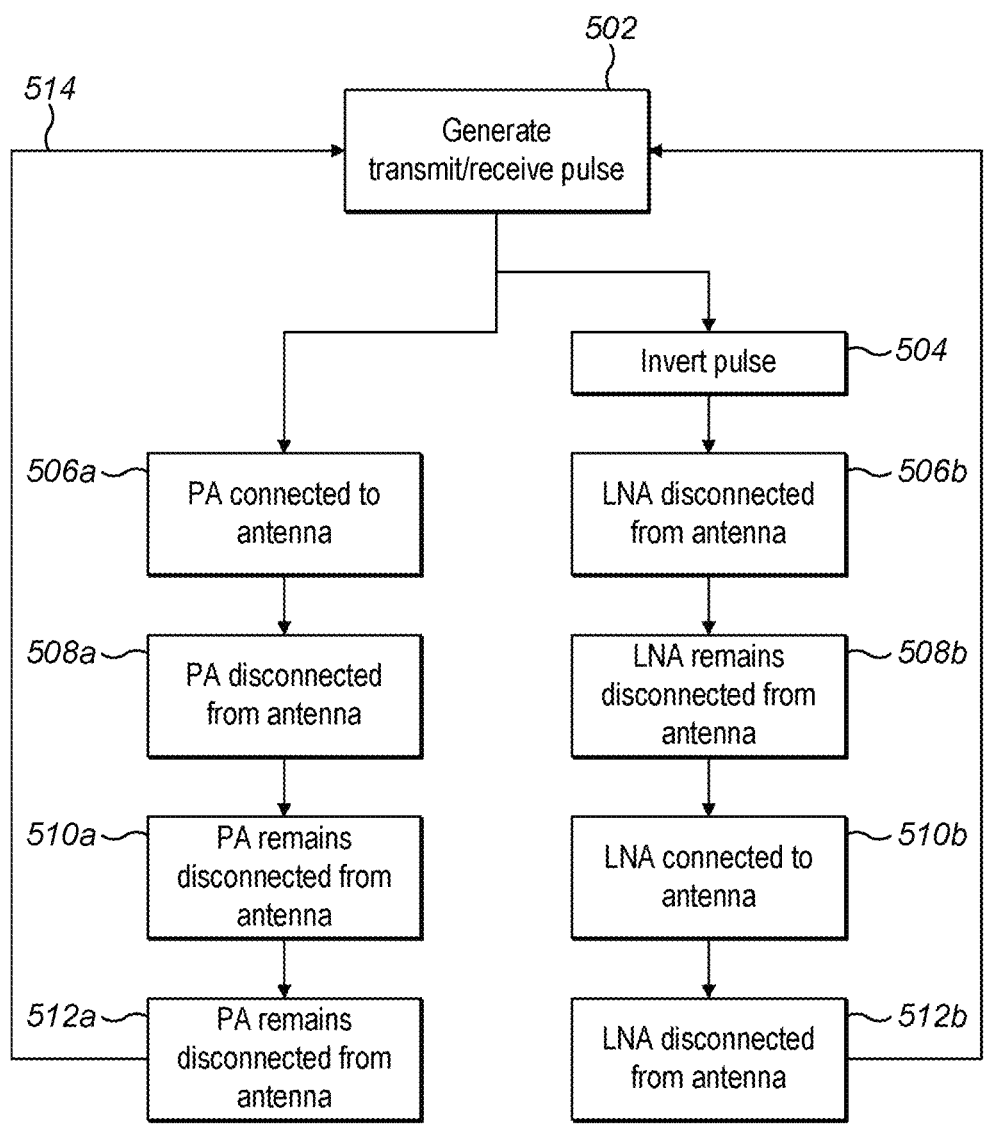
FIG. 8 is a flowchart of the steps executed by the system of FIG. 1, according to some embodiments of the invention.

FIG. 8 shows a flowchart of the operation of the system 100 for a single transmit/receive pulse. Referring also to FIGS. 1 and 2, the left branch of FIG. 8 represents the operation of the RF switch driver 155, and the right branch represents the operation of the RF switch driver 156. Note that steps contained within boxes that are drawn side-by-side occur at the same time. Also note that the word "connect" here refers to an RF switch sending an RF signal to a device, and the word "disconnect" refers to an RF signal being blocked by an RF switch from being sent to a device. At step 502, the computer system 140 generates a transmit/receive pulse. For the branch on the right, the pulse is inverted at step 504 using an inverter 111. However, it can be appreciated that the inverter 111 can be in either branches.

Subsequently, and referring also to table 1, since the transmit/receive pulse is in state 0 for the left branch, the RF switch driver 155 outputs −30 V to the RF switch 171, turning the RF switch 171 "on". This means that at step 506a, the RF switch 171 connects the antenna 110 to the PA 120. Additionally, since the same transmit/receive pulse is received by the PA driver 107, the PA driver 107 is activated, and as a result the PA 120 is also activated (step not shown). However, the RF switch driver 156 outputs +5 V to the RF switch 172, turning the switch 172 "off". This enables the antenna 110 to disconnect from the LNA 130 at step 506b (note that the disconnecting step 506b refers specifically to when the RF switch driver 156 outputs +5 V to the RF switch 172). Since the same (inverted) pulse is also received by the LNA driver 108, the LNA driver 108 is deactivated, thus deactivating the LNA 130 (step not shown). The antenna 110 is now in transmission mode.

Subsequently, the transmit/receive pulse transitions from state 0 to 1 for the left branch, and from 1 to 0 for the right branch. This means that the RF switch drivers 155 and 156 both now output 0 V to RF switches 171 and 172, respectively, switching both RF switches 155 and 156 "off". Thus, the PA 120 is disconnected from the antenna 110 at step 508a, and the LNA 130 remains disconnected from the antenna 110 at step 508b. Additionally, the PA 120 is deactivated, and the LNA 130 remains deactivated. As mentioned previously, this transition period exists for a finite amount of time as a result of the dead-time generator 202 to protect the RF switch 170 and other components of the system from a short circuit. During this transition period, the antenna 110 is neither in the transmission or reception mode. This marks the end of a first half of the transmit/receive pulse.

The transmit/receive pulse then enters the 1 state for the left branch, and state 0 for the right branch. Thus, the RF switch driver 155 outputs +5 V to the RF switch 171 turning the RF switch 171 "off", and the RF switch driver 156 outputs −30 V to the RF switch 172 tuning the RF switch 172 "on". This enables the antenna 110 to remain disconnected from the PA 120 at step 510a, and connect to the LNA 130 at step 510b. Additionally, the PA driver 120 remains deactivated, while the LNA 130 is now activated. The antenna 110 is now in reception mode.

Subsequently, the transmit/receive pulse transitions from 1 to 0 for the left branch, and from 0 to 1 for the right branch. This means that the RF switch drivers 155 and 156 both again output 0 V to RF switches 171 and 172, respectively, switching both RF switches 155 and 156 "off". The PA 120 remains disconnected from the antenna 110 at step 512a, and the LNA 130 is disconnected from the antenna 110 at step 512b. Additionally, the PA 120 remains deactivated, and the LNA 130 is deactivated. As before, this transition period exists for a finite amount of time as a result of the dead-time generator 202 to protect the RF switch 170. As before, during this time period the antenna 110 cannot be considered to be in transmission or reception mode. This marks the end of a second (or final) half of the transmit/receive pulse.

Subsequently, the whole process is repeated with the arrival of the next transmit/receive pulse (step 514).

It will be understood that the benefits and advantages described above may relate to one embodiment or may relate to several embodiments. The embodiments are not limited to those that solve any or all of the stated problems or those that have any or all of the stated benefits and advantages. Variants should be considered to be included into the scope of the invention.

Any reference to 'an' item refers to one or more of those items. The term 'comprising' is used herein to mean including the method steps or elements identified, but that such steps or elements do not comprise an exclusive list and a method or apparatus may contain additional steps or elements.

As used herein, the terms "component" and "system" are intended to encompass computer-readable data storage that is configured with computer-executable instructions that cause certain functionality to be performed when executed by a processor. The computer-executable instructions may include a routine, a function, or the like. It is also to be understood that a component or system may be localized on a single device or distributed across several devices.

Further, as used herein, the term "exemplary" is intended to mean "serving as an illustration or example of something".

Further, to the extent that the term "includes" is used in either the detailed description or the claims, such term is intended to be inclusive in a manner similar to the term "comprising" as "comprising" is interpreted when employed as a transitional word in a claim.

The figures illustrate exemplary methods. While the methods are shown and described as being a series of acts that are performed in a particular sequence, it is to be understood and appreciated that the methods are not limited by the order of the sequence. For example, some acts can occur in a different order than what is described herein. In addition, an act can occur concurrently with another act. Further, in some instances, not all acts may be required to implement a method described herein.

The order of the steps of the methods described herein is exemplary, but the steps may be carried out in any suitable order, or simultaneously where appropriate. Additionally, steps may be added or substituted in, or individual steps may be deleted from any of the methods without departing from the scope of the subject matter described herein. Aspects of any of the examples described above may be combined with aspects of any of the other examples described to form further examples without losing the effect sought.

It will be understood that the above description of a preferred embodiment is given by way of example only and that various modifications may be made by those skilled in the art. What has been described above includes examples of one or more embodiments. It is, of course, not possible to describe every conceivable modification and alteration of the above devices or methods for purposes of describing the aforementioned aspects, but one of ordinary skill in the art can recognize that many further modifications and permutations of various aspects are possible. Accordingly, the described aspects are intended to embrace all such alterations, modifications, and variations that fall within the scope of the appended claims.

What is claimed is:

1. A system for switching one or more antennas between transmit and receive modes, the system comprising:
   a power amplifier and a low-noise amplifier for each antenna arranged to amplify RF signals during the transmit and receive modes of the antenna respectively; and
   a RF switching circuit, wherein the RF switching circuit comprises:
      one or more RF switches, each RF switch arranged to connect one of the amplifiers to the corresponding antenna during the respective transmit or receive modes, and
      first and second RF switch drivers, connected to the one or more RF switches for driving the one or more RF switches during the respective transmit and receive modes of the one or more antennas, wherein each RF switch driver comprises an isolated gate driver arranged to receive a periodic switching signal.

2. The system according to claim 1, wherein the first and second RF switch drivers further comprise a power switch connected to the output of the isolated gate driver for periodically supplying voltage to the one or more RF switches to drive the one or more RF switches.

3. The system according to claim 2, wherein the power switch comprises a P-channel (PMOS) MOSFET and an N-channel (NMOS) MOSFET.

4. The system according claim 1, wherein the first and second RF switch drivers further comprise an adjustable dead-time generator connected to an input of the isolated gate driver, wherein the adjustable dead-time generator is configured to cause a delay in switching of the one or more switches.

5. The system according to claim 4, wherein the adjustable dead-time generator comprises a plurality of multiplexers.

6. The system according to claim 5, wherein the multiplexers comprise 4-1 multiplexers.

7. The system according to claim 5, comprising two multiplexers.

8. The system according to claim 7, wherein at least one of the RF switches comprises a RF PIN diode switch.

9. The system according to claim 7, wherein at least one of the RF switches comprises one of a SPDT RF switch, a DPDT RF switch, and a SPST RF switch.

10. The system according to claim 1, wherein the first and second RF switch drivers are each connected to a plurality of RF switches.

11. The system according to claim 1, wherein each antenna comprises a phased array antenna.

12. The system according to claim 11, wherein the phased array antenna comprises a synthetic aperture radar antenna.

13. The system according to claim 1, wherein each antenna is mounted on a satellite.

14. The system according to claim 1, wherein the antenna comprises an antenna configured for synthetic aperture radar imaging.

15. The system according to claim 1, wherein the first and second RF switch drivers further comprise a power switch connected to the isolated gate driver for periodically supplying voltage to the one or more RF switches to drive the one or more RF switches.

16. The system according to claim 1, wherein the system further comprises a power amplifier driver for and connected to each power amplifier, wherein the power amplifier driver is configured to receive a transmit/receive pulse to drive the power amplifier.

17. The system according to claim 1, wherein the system further comprises a low-noise amplifier driver for and connected to each low-noise amplifier, wherein the low noise amplifier driver is configured to receive a transmit/receive pulse to drive the low-noise amplifier.

18. The system according to claim 1, wherein the system further comprises a RF divider for and connected to each power amplifier for delivering a signal to the power amplifier.

19. The system according to claim 1, wherein the system further comprises a RF combiner for and connected to each low-noise amplifier for receiving a signal from the low-noise amplifier.

20. The system according to claim 1, wherein each RF switch comprises first and second RF switch elements corresponding to the transmit and receives modes, respectively.

21. The system according to claim 20, wherein the first and second switch elements each comprise PIN diodes.

* * * * *